United States Patent
Iwamatsu

(10) Patent No.: US 7,551,031 B2
(45) Date of Patent: Jun. 23, 2009

(54) AMPLIFIER

(75) Inventor: Masayuki Iwamatsu, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 0 days.

(21) Appl. No.: 12/154,944

(22) Filed: May 28, 2008

(65) Prior Publication Data

US 2008/0297257 A1   Dec. 4, 2008

(30) Foreign Application Priority Data

May 30, 2007   (JP)   ............................ 2007-143177

(51) Int. Cl.
*H03G 3/12* (2006.01)
(52) U.S. Cl. ..................................... 330/282; 330/279
(58) Field of Classification Search ................ 330/282, 330/279, 85, 86
See application file for complete search history.

(56) References Cited

U.S. PATENT DOCUMENTS

| 4,166,981 A | * | 9/1979 | Marchasson et al. | ............. 330/52 |
| 5,408,197 A | * | 4/1995 | Miyake | ........................ 330/129 |
| 6,909,323 B2 | * | 6/2005 | Ueno et al. | ..................... 330/86 |

* cited by examiner

*Primary Examiner*—Henry K Choe
(74) *Attorney, Agent, or Firm*—Pillsbury Winthrop Shaw Pittman LLP

(57) ABSTRACT

The amplifier comprises an inverting negative feedback amplifier circuit using an operational amplifier, a comparator for comparing the potential of the negative phase input terminal of the operational amplifier with the reference potential Vref of the comparator, and a low-pass filter. The imaginary short state of the operational amplifier is lost when clipping occurs on the output signal. It is thus possible to detect clipping by monitoring the potential of the negative phase input terminal.

5 Claims, 4 Drawing Sheets

AMPLIFIER

BACKGROUND OF THE INVENTION

The present invention relates to an amplifier and in particular to an amplifier for detecting an excessive input at a predetermined level and controlling the attenuation of an input signal.

An amplifier in the related art is designed to prevent clipping caused by an excessive input by attenuating an input signal on detecting that the output potential exceeds a predetermined value, for example, power potential. According to the technique described in JP-A-10-163769, since detection of an output potential alone does not allow reliable determination on the presence of clipping, an input signal is attenuated after occurrence of clipping is surely detected.

The above technique is focused on prevention of clipping. Thus, when clipping occurs or there is a high probability that clipping will occur, the input signal is immediately attenuated. This control triggers attenuation too early and somewhat lacks the feeling of sound volume. Thus, attenuation control of an input signal is in need that prevents excessive distortion caused by an excessive input while maintaining the feeling of sound volume.

SUMMARY OF THE INVENTION

The invention has been accomplished in view of the above problems. An object of the invention is to control clipping by quantitatively grasping the degree of an excessive input.

In order to solve the problems, the invention provides an amplifier comprising:

a variable gain unit that adjusts amplitude of an input signal and outputs an output signal;

a negative feedback amplifying unit that includes an operational amplifier for amplifying the output signal of the variable gain unit; and a controller that compares a potential difference between a positive phase input terminal and a negative phase input terminal of the operational amplifier with a reference potential and detects presence of clipping in the output signal of the negative feedback amplifying unit based on the result of the comparison to control the variable gain unit, thereby controlling the clipping.

With the invention, it is possible to quantitatively grasp an excessive input by comparing the potential difference between the positive phase input terminal and negative phase input terminal of an operational amplifier with a predetermined reference potential of the comparator. Clipping is permitted up to an excessive input at a preset level. This prevents an unreasonably excessive input without impairing the feeling of sound volume.

To be more precise, preferably, the controller includes a comparator for comparing the potential of the negative phase input terminal with the reference potential, and the reference-potential becomes almost the same as the potential of the negative phase input terminal of the operational amplifier when the amplitude of the output signal of the negative feedback amplifying unit increases and becomes large enough to generate clipping in the output signal.

The variable gain means preferably adjusts the amplitude of the input signal in accordance with a control signal. Preferably, the control means includes integrating means for integrating the output signal of the comparison means and supplies as the control signal the output signal of the integrating means to the variable gain means. It is thus possible to provide the stability of a feedback system.

In this example, the integrating means may use different time constants for the rising edge and trailing edge of the output signal of the comparison means. In particular, the time constant for the rising edge is desirably smaller than that for the trailing edge. This assures a relatively fast, attack time to prevent unreasonably excessive input and a relatively slow release time to gradually recover the acceptable level.

10: Amplifier
20: Negative feedback amplifier circuit
21: Operational amplifier
30: Voltage controlled attenuator (VCA)
40: Control circuit
41: comparator (Comp)
42: low-pass filter

DETAILED DESCRIPTION OF PREFERRED EMBODIMENTS

Figure 1:
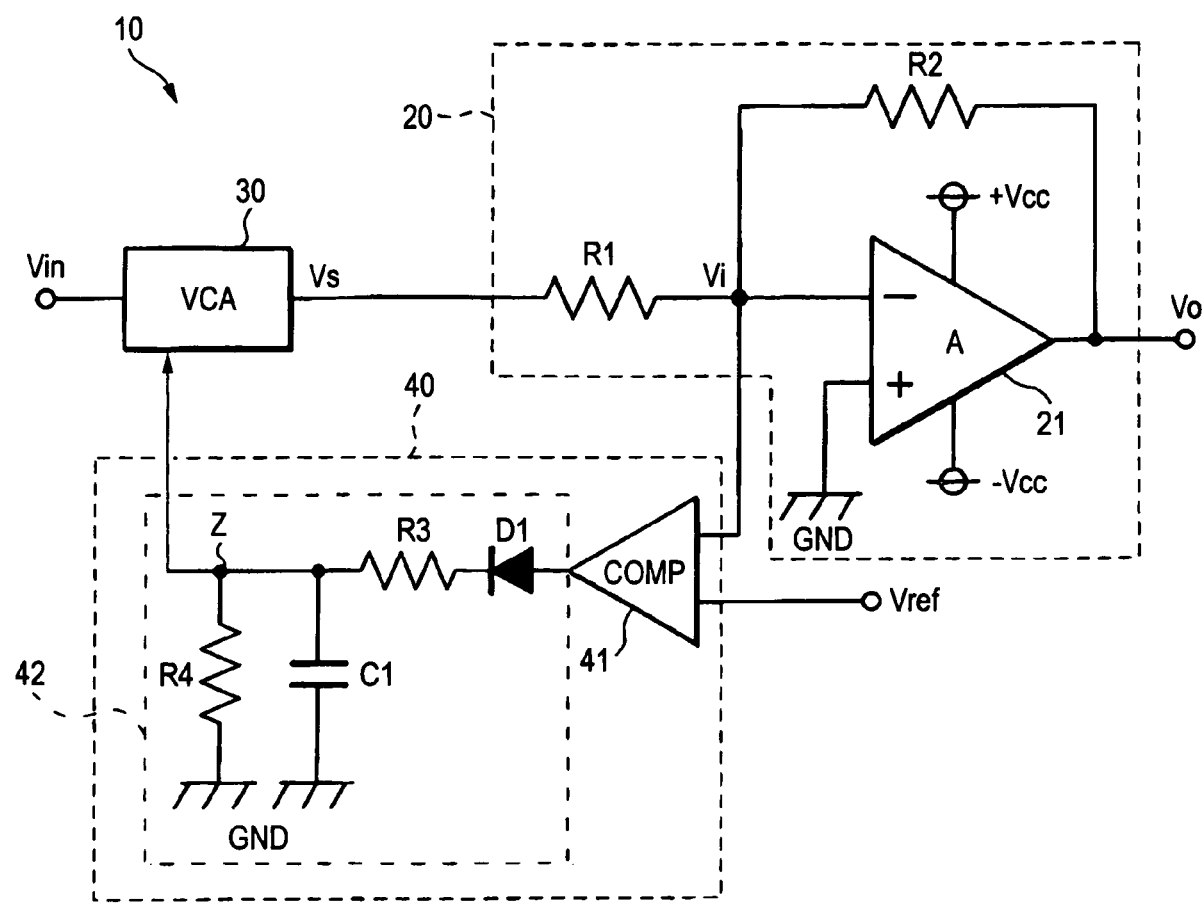
FIG. 1 is a circuit diagram showing a configuration of an amplifier according to the embodiment.

Embodiments of the invention will be described referring to drawings. FIG. 1 is a circuit diagram showing the configuration of an amplifier according to the embodiment. As shown in FIG. 1, an amplifier 10 for amplifying an input signal Vin and outputting the amplified signal as an output signal Vo includes: an inverting negative feedback amplifier circuit 20 having an operational amplifier 21 operating on the power potential of ±Vcc, a resistor R1 and a resistor R2; a voltage controlled attenuator (VCA) 30 for attenuating the input signal Vin as required; and a control circuit 40 for controlling the VCA 30.

The output of the VCA 30 is inputted as Vs to the negative feedback amplifier circuit 20. The control circuit 40 includes a comparator 41 for comparing the potential Vi of the inverting-input terminal of the operational amplifier 21 with the reference potential Vref of the operational amplifier 21, and a low-pass filter 42. The low-pass filter 42 functions as an integrator and includes a diode D1 having an anode receiving the output of the comparator 41, a resistor R3 arranged between a node Z and the cathode of the diode D1, and a capacitor C1 and a resistor R4 arranged between the node Z and a ground potential GND. A signal extracted from the node Z of the low-pass filter 42 is inputted to the VCA 30. As described later, the low-pass filter 42 can individually set a response for the rising edge of the output signal of the comparator 41 and for the trailing edge of the output signal of the comparator 41.

Figure 2:
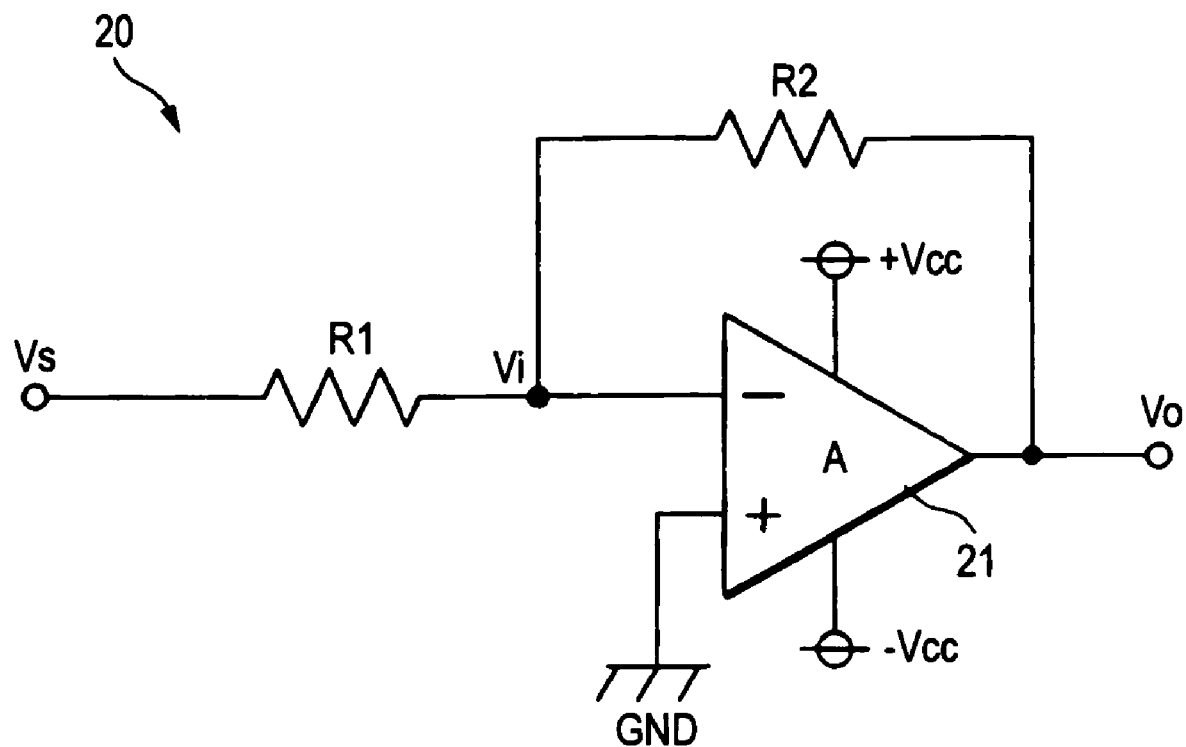
FIG. 2 shows a negative feedback amplifier circuit of the amplifier.

The concept of the embodiment will be described referring to FIG. 2 showing the negative feedback amplifier circuit 20 of the amplifier 10. In general, the following relationship holds in the inverting negative feedback amplifier circuit 20 where A represents the gain of the operational amplifier 21.

$$\begin{cases} \dfrac{(Vs - Vi)}{R1} + \dfrac{(Vo - Vi)}{R2} = 0 \\ Vo = -A \cdot Vi \end{cases} \quad \text{Expression 1}$$

Thus, the input/output gain assumed in a state where the amplifier 10 is used as a typical negative feedback amplifier circuit is as shown below. The state where the amplifier 10 is used as a typical negative feedback amplifier circuit refers to a state whether the output Vo is within the range of ±Vcc and clipping is absent.

$$\dfrac{Vo}{Vs} = -\dfrac{AR2}{AR1 + (R1 + R2)} \quad \text{Expression 2}$$

and $$Vi = \dfrac{R2}{AR1 + (R1 + R2)} \cdot Vs \quad \text{Expression 3}$$

are obtained. In case the gain A is sufficiently large, the following relationship holds:

$$\dfrac{Vo}{Vs} = -\dfrac{R2}{R1} \quad \text{Expression 4}$$

In the state where the amplifier 10 is used as a typical negative feedback amplifier circuit, the positive phase input terminal and the negative phase input terminal of the operational amplifier 21 are in the imaginary short state at the same potential. The positive phase input terminal is connected to the ground potential GND so that Vi is set to 0.

Next, a state is assumed where the input potential Vs is excessive and clipping is present in the negative feedback amplifier circuit 20. The potential Vs is excessive in the positive direction in this example for simplicity. When clipping occurs, the output potential Vo of the operational amplifier 21 becomes almost equal to the power potential −Vcc. In this state, an imaginary short is lost. The potential Vi of the negative phase input terminal is a value corresponding to a value obtained by dividing the difference between the output potential Vo (=−Vcc) and the input potential Vs by the resistor R1 and resistor R2. That is, the following relationship holds:

$$Vi = Vs - (Vs + Vcc) \cdot \dfrac{R1}{R1 + R2} \quad \text{Expression 5}$$

In case the potential of the output signal Vo is one obtained using an operational amplifier conforming to specifications not satisfying the power potential of −Vcc, Vi is calculated using the potential of the output signal Vo in the presence of clipping. Or, Vi may be experimentally obtained.

Figure 3:
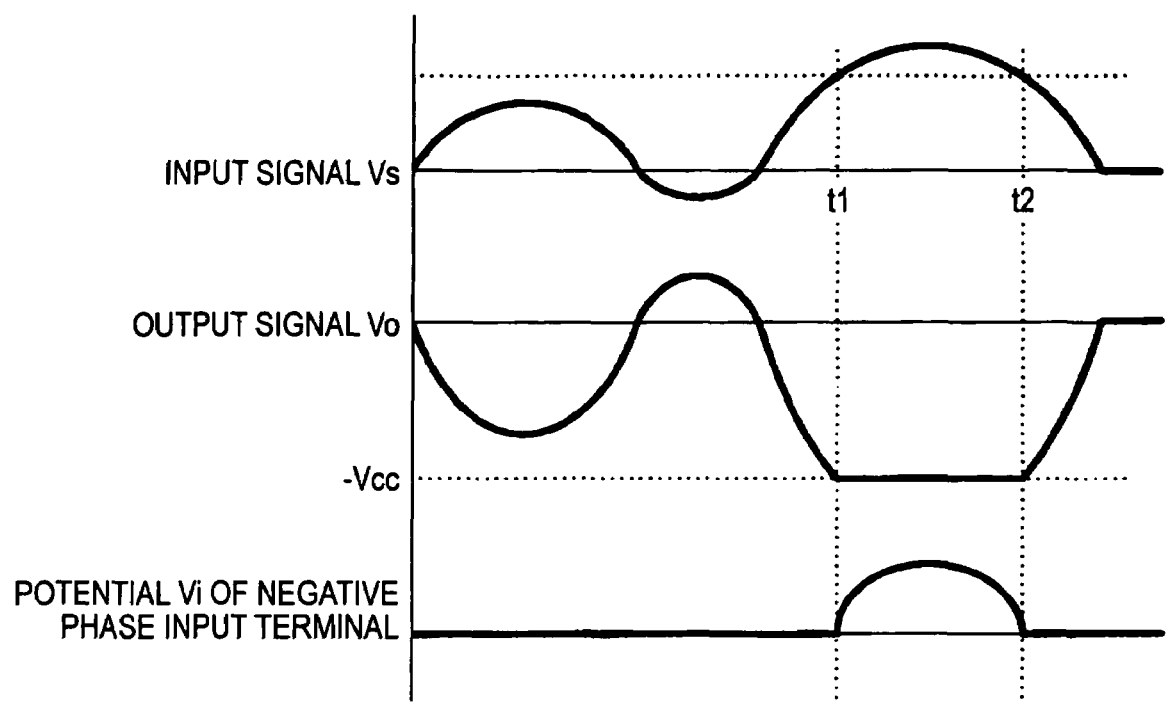
FIG. 3 shows a relationship between an input signal Vs and output signal Vo and the potential Vi of a negative phase input terminal of the negative feedback amplifier circuit.

FIG. 3 shows the relationship between the input signal Vs and output signal Vo and the potential Vi of the negative phase input terminal of the negative feedback amplifier circuit 20. In the illustrated example, clipping does not appear and normal negative feedback amplification takes place until the time t1. Thus, an imaginary short is established between the positive phase input terminal and negative phase input terminal of the operational-amplifier 21 and the potential Vi of the negative phase input terminal is almost 0. The output potential Vo is amplified with the input potential Vs inverted.

The amplitude of the input signal Vs becomes excessive from the time t1 to time t2 and the output signal Vo is clipped with −Vcc. The imaginary short is lost in this period and the relationship of Expression 5 applies. Thus, the potential Vi of the negative phase input terminal corresponds to the potential of the input signal Vs. That is, it is possible to detect that the output signal Vo is clipped by detecting the potential Vi of the negative phase input terminal.

Through modification of Expression 5, the following expression is obtained:

$$Vi = \dfrac{R2}{R1 + R2} Vs - \dfrac{R1}{R1 + R2} Vcc \quad \text{Expression 6}$$

The resistance values of the resistors R1 and R2 and the power potential Vcc are constants. The potential Vi occurring at the negative phase input terminal upon clipping is proportional to the potential of the input signal Vs.

Further description will be made using more specific values. Assume a negative feedback amplifier circuit 20 having R1 of 1 kΩ, R2 of 10 kΩ and an amplification factor of 10. Assume that the gain A of the operational amplifier 21 is 80 dB (10000 times) and the power potential ±Vcc is ±10V.

With the amplification factor of 10 and the power potential of ±10V, the maximum input signal Vs used as a typical negative feedback amplifier circuit without clipping is 1V. In this case, Expression 3 applies so that the following expression holds:

$$\begin{aligned} Vi &= \dfrac{10\,\text{k}}{10000 \times 1\,\text{k} + (1\,\text{k} + 10\,\text{k})} \cdot 1 \quad \text{Expression 7} \\ &= \dfrac{10}{10000 + 11} \\ &= 0.0009989 \text{ V} \\ &= 0.9989\,\text{mV} \end{aligned}$$

In other words, an imaginary short is established so that the potential Vi of the negative phase input terminal is equal to or less than 1 mv and may be assumed as almost 0.

Next, Vs=1.1 V as an excessive input of 10% as an input signal Vs is supplied to generate clipping. In this case, Expression 5 applies and the following relationship holds:

$$\begin{aligned} Vi &= 1.1 - (1.1 + 10) \cdot \dfrac{1\,\text{k}}{1\,\text{k} + 10\,\text{k}} \quad \text{Expression 8} \\ &= 0.0909091\,\text{V} \\ &= 90.909\,\text{mV} \end{aligned}$$

Figure 4:
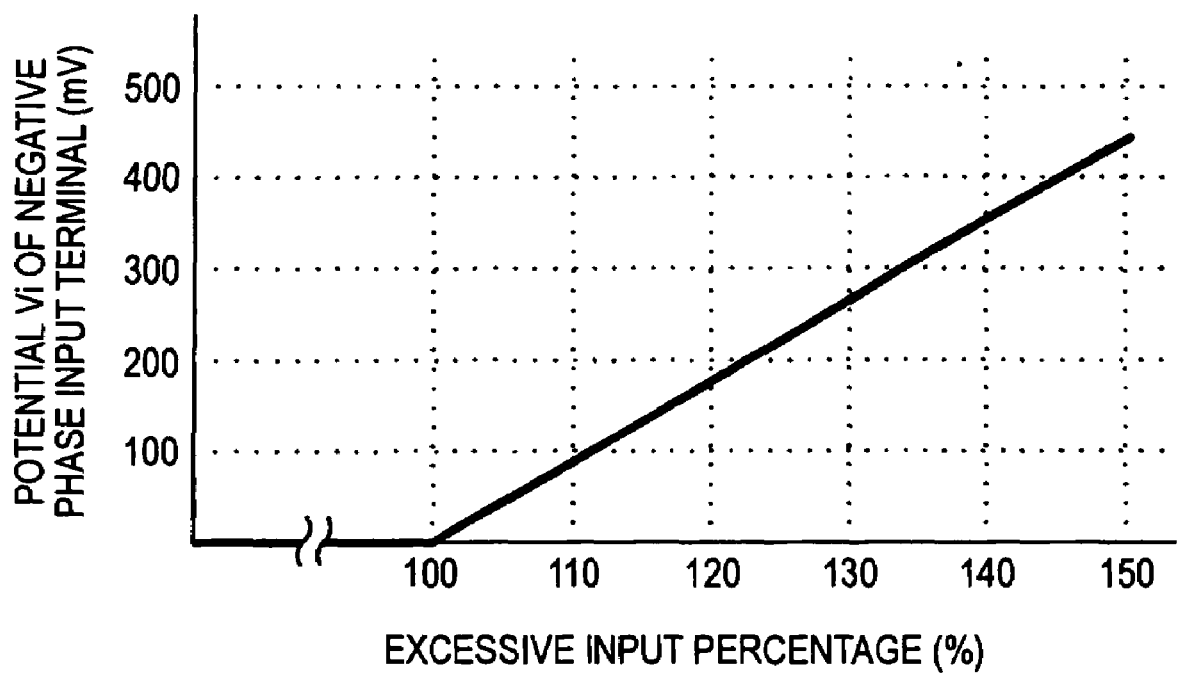
FIG. 4 shows a relationship between a degree of an excessive input and the potential Vi of the negative phase input terminal.

When clipping appears due to an excessive input of 10%, the potential Vi of the negative phase input terminal is about 90 times as larger as the potential assumed when clipping is absent. Similarly, obtained potentials Vi of the negative phase input terminal for excessive inputs of 20%, 30%, 40%, and 50% are respectively 181.82 mV, 272.73 mV, 363.64 mV, and 454.55 mV. As understood from FIG. 4, the degree of an excessive input has a linear relationship to the potential Vi of the negative phase input terminal. It is thus possible to quantatively grasp the degree of an excessive input from the potential Vi of the negative phase input terminal.

Referring to FIG. 1, when the comparator 41 is set to operate on ±90.9 mv, that is, when Vref is set to 90.9 mv, it is possible to detect that clipping is established due to an excessive input of 10%. By controlling the VCA 30 with the output signal of the comparator 41 and attenuating the input signal Vin, an amplifier is obtained that permits clipping up to an excessive input of 10% and attenuates the input signal Vin at an excessive input above 10%. Similarly, by adjusting the operating potential of the comparator 41, that is, the potential of Vref, clipping caused by an excessive input of 20%, 30%, 40% or 50% may be detected. With this approach, in case clipping caused by a predetermined degree of excessive input is detected, the VCA 30 is operated to attenuate the input signal Vin.

In the embodiment, it is made possible to quantatively grasp an excessive input, so that clipping is permitted up to a predetermined degree of excessive input. Such control is made because it is proven that clipping up to some degree of distortion is not always offensive to human ears as a result of auditory testing. With this embodiment, it is possible to prevent an unreasonably excessive input without impairing the feeling of sound volume.

On the output side of the comparator 41 is arranged a low-pass filter 42 (integrator circuit) for a stabilized feedback system and it is made possible to individually adjust the attack time and the release time. In other words, the value of the resistor R4 is set sufficiently greater than that of the resistor R3. The attack time determined by the time constants of the resistor R3 and the capacitor C1 applies to the rising edge of the output signal of the comparator 41. The release time determined by the time constants of the resistor R4 and the capacitor C1 applies to the trailing edge of the output signal of the comparator 41 because no currents flow through the resistor R3 due to the presence of a diode D1. In general, it is desirable to set the time constant for the rising edge shorter than that for the trailing edge in order to provide a relatively fast attack time to prevent an unreasonably excessive input and a relatively slow release time to gradually recover the acceptable level.

While the voltage controlled attenuator (VCA) 30 is used as an attenuator of an input signal in the above embodiment, the invention is not limited thereto. For example, a resistance dividing type electronic volume may be used. Or, any type of variable gain means for adjusting the amplitude of an input signal and outputting the resulting signal may be used. The invention is applicable to various operation modes of an amplifier, not only Class A, Class AB, Class D and the like. The comparator 41 or control circuit 40 for detecting the potential Vi of the negative phase input terminal upon clipping may be provided individually for each of the positive and negative values of the potential Vi.

In the above embodiment, the potential of the positive phase input terminal of the operational amplifier 21 is 0V (ground potential) so that an imaginary short is lost when the potential Vi of the negative phase input terminal>0 thus allowing detection of clipping. More generally, when the potential difference between the positive phase input terminal and negative phase input terminal of the operational amplifier has exceeded 0V, clipping is detected. That is, the control circuit 40 may detect the potential difference between the positive phase input terminal and negative phase input terminal of the operational amplifier and the comparator 41 may compare the detected potential difference with the reference potential Vref.

While an inverting amplifier is used as a negative feedback amplifier circuit 20 in the above embodiment, a non-inverting amplifier using an operational amplifier may be used instead. In this case, the output signal Vs of the VCA 30 is supplied to the positive phase input terminal of the operational amplifier. Then, the resistor R1 is arranged between the negative phase input terminal and the ground potential GND of the operational amplifier, and the resistor R2 is arranged between the negative phase input terminal and the output terminal of the operational amplifier. In this case also, clipping occurs only when an imaginary short is lost.

It is thus possible to detect clipping by monitoring the potential difference between the positive phase input terminal and negative phase input terminal of the operational amplifier, same as the above embodiment. The potential difference between the positive phase input terminal and negative phase input terminal of the operational amplifier may be detected and the detected potential difference may be compared with the reference potential Vref by the comparator 41. In case the reference potential Vref is set to 0V, one of the input terminals of the comparator 41 is connected to the positive phase input terminal of the operational amplifier and the other input terminal of the comparator 41 is connected to the negative phase input terminal of the operational amplifier.

What is claimed is:

1. An amplifier comprising:
   a variable gain unit that adjusts amplitude of an input signal and outputs an output signal;
   a negative feedback amplifying unit that includes an operational amplifier for amplifying the output signal of the variable gain unit; and
   a controller that compares a potential difference between a positive phase input terminal and a negative phase input terminal of the operational amplifier with a reference potential and detects presence of clipping in the output signal of the negative feedback amplifying unit-based on the result of the comparison to control the variable gain unit, thereby controlling the clipping.

2. The amplifier according to claim 1, wherein
   the controller includes a comparator for comparing the potential of the negative phase input terminal with the reference potential, and
   the reference potential becomes almost the same as the potential of the negative phase input terminal of the operational amplifier when the amplitude of the output signal of the negative feedback amplifying unit increases and becomes large enough to generate clipping in the output signal.

3. The amplifier according to claim 2, wherein
   the variable gain unit adjusts the amplitude of the input signal in accordance with a control signal, and
   the controller includes an integrator for integrating the output signal of the comparator and supplies as the control signal the output signal of the integrator to the variable gain unit.

4. The amplifier according to claim 3, wherein the integrator uses different time constants for a rising edge and a trailing edge of the output signal of the comparator.

5. The amplifier according to claim 4, wherein the time constant for the rising edge is smaller than that for the trailing edge.

* * * * *